United States Patent

[11] 3,571,742

[72] Inventor Robert D. Wengenroth
Liverpool, N.Y.

[21] Appl. No. 732,719
[22] Filed May 28, 1968
[45] Patented Mar. 23, 1971
[73] Assignee General Electric Company

[54] PUSH-PULL DISTRIBUTED AMPLIFIER
5 Claims, 4 Drawing Figs.

[52] U.S. Cl. .......... 330/54, 330/118
[51] Int. Cl. .......... H03f 3/60
[50] Field of Search .......... 330/54

[56] References Cited

UNITED STATES PATENTS

| | | | |
|---|---|---|---|
| 2,930,986 | 3/1960 | Kobbe et al. | 330/54 |
| 3,155,916 | 11/1964 | Gerr | 330/54 |

*Primary Examiner*—Nathan Kaufman
*Attorneys*—Norman C. Fulmer, Carl W. Baker, Frank L. Neuhauser, Oscar B. Waddell and Melvin M. Goldenberg

ABSTRACT: A broadband, push-pull distributed amplifier is disclosed, the amplifier stages being individually connected for push-pull operation. The amplifier is capable of Class B or AB operation with high efficiency and low distortion.

INVENTOR:
ROBERT D. WENGENROTH,

BY Norman C. Fulmer
HIS ATTORNEY.

INVENTOR:
ROBERT D. WENGENROTH,
BY Norman C. Fulmer
HIS ATTORNEY.

PUSH-PULL DISTRIBUTED AMPLIFIER

BACKGROUND OF THE INVENTION

The invention is in the field of amplifiers, of the distributed type, for amplifying electrical signals.

Distributed amplifiers employ distributed lines (sometimes called transmission lines) for the input and output signals. Amplifier devices, such as tubes or transistors, are connected between the input and output distributed lines, at distributed points therealong such that each amplification path has the same overall signal delay. The distributed lines comprise a plurality of series inductances and shunt capacitances. The arrangement is such that the shunt capacitances of the input and output lines incorporate the inherent input and output capacitances of the amplifier devices. Thus, the distributed line amplifier is capable of amplifying a wide range of signal frequencies, without being as limited at the high-frequency end by the input and output capacitances of the amplifier devices as is the case with other types of amplifier circuits. The amount of gain depends on the type and number of amplifier devices employed, the amplifier devices being distributed at points along the input and output lines so as to have an additive amplification effect. Operation is "Class A," with each amplifier device operating in a linear manner, for low signal distortion.

For push-pull operation, two of the aforesaid distributed amplifier arrangements are connected together at their input and output ends for a push-pull signal input and push-pull signal output. For linear operation—i.e., low distortion—the amplifier devices must be operated in Class A. If Class B or AB operation is attempted, considerable distortion occurs and the normally high efficiency for these classes of operation cannot be realized.

SUMMARY OF THE INVENTION

Objects of the invention are to provide an improved push-pull distributed amplifier, and to provide such an amplifier capable of Class B or AB operation with high efficiency and low distortion as compared to previous push-pull distributed amplifiers.

The invention comprises, briefly and in a preferred embodiment, a push-pull distributed amplifier wherein the amplifier stages are individually connected for push-pull operation. More specifically, each individual push-pull amplifier stage is provided with a balanced output coupling device for providing push-pull operation and cancellation of distortion components. The invention further comprises specific circuitry for achieving individual push-pull operation of the amplifier stages in a distributed amplifier. The invention achieves improved Class B and AB operation, with high efficiency and low distortion, primarily due to cancellation of undesired even-harmonic distortion components in the individual push-pull load impedances, thus preventing these spurious distortion components from reaching, and travelling in or reflecting along, the signal output distributed lines.

DESCRIPTION OF THE PREFERRED EMBODIMENTS

Figure 1:
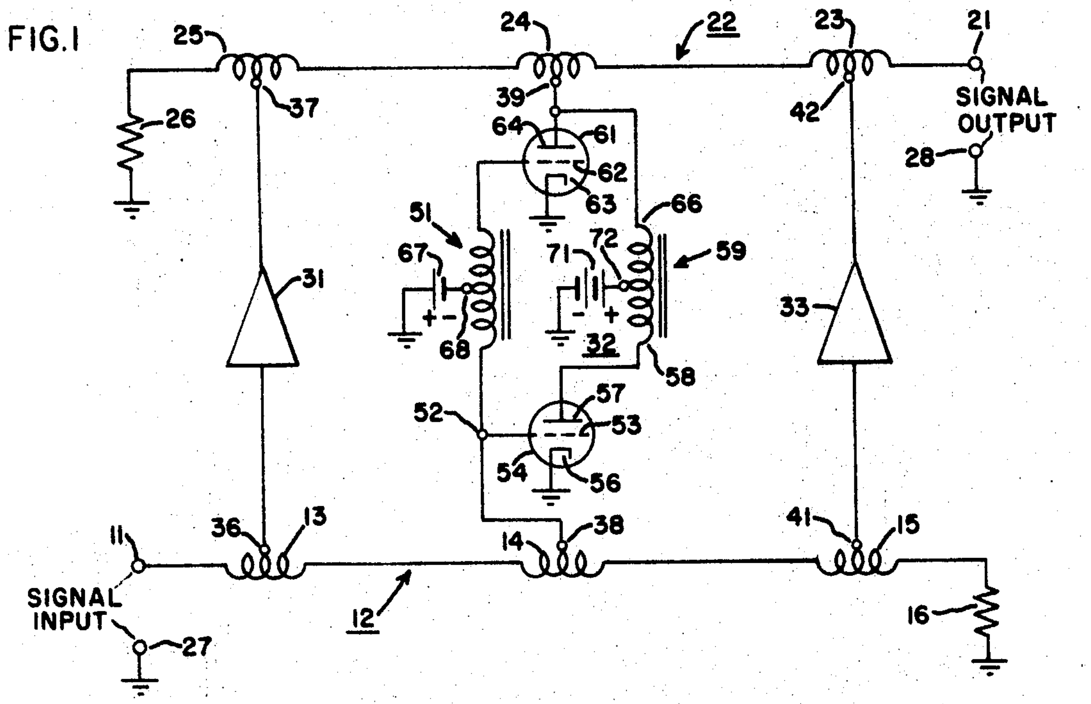
FIG. 1 is an electrical schematic diagram of a preferred embodiment or the invention.

Now referring to the embodiment shown in FIG. 1, a signal input terminal 11 is connected to an end of a distributed line 12 comprising a plurality of inductors 13, 14 and 15 connected in series. The remaining end of the distributed line 12 is terminated by a shunt-connected resistor 16 having a value of resistance equal to the characteristic impedance of the distributed line 12. A signal output terminal 21 is connected to an end of an output signal distributed line 22 shown as comprising a plurality of inductors 23, 24, and 25 connected in series, the remaining end of the output distributed line 22 being terminated by a shunt-connected resistor 26 having a resistance equal to the characteristic impedance of the output line 22. The signal input and output connections are completed by electrically grounded return connection terminals 27 and 28.

Signal amplifiers 31, 32, and 33 are connected between the input and output distributed lines 12 and 22 in the manner shown, the amplifier 31 being connected between a center tap 36 of inductor 13 and a center tap 37 of output inductor 25; the amplifier 32 being connected between a center tap 38 of input inductor 14 and a center tap 39 of output inductor 24; and the amplifier 33 being connected between a center tap 41 of input inductor 15 and a center tap 42 of output inductor 23. Thus, the first amplifier 31 is connected between the inductor 13 nearest the signal input terminal 11 and the inductor 25 farthest from the output signal terminal 21, and so on, so that the signal amplification paths provided by the various amplifiers will have equal time delays. The inherent input and output capacitances of the amplifiers function as shunt capacitances for the distributed lines 12 and 22, respectively. The lines 12 and 22 may comprise continuous windings tapped at suitable points or other forms of artificial transmission line, instead of individual tapped inductors as shown. There may also be more or fewer signal amplifier stages than the three shown.

The circuit thus far described operates, generally, in the following manner. An input signal applied at terminals 11 and 27 travels down the input distributed line 12, to the terminating impedance 16. As the input signal reaches the center taps of the inductors of the input line, it is amplified by the amplifiers and the amplified version thereof is fed into the center taps of the respective output line inductors, whereupon the amplified output signals travel down the output line 22 to the signal output terminal 21. The output line terminating impedance 26 prevents any substantial undesired reflections from occurring. Due to the arrangement of the amplifiers along the input and output lines, the amplified signal outputs of the amplifiers add together to provide a larger amplified output signal at the signal output terminal 21. Additional line sections and amplifiers may be employed to provide greater total amplification. If desired, terminating half sections of distributed line may be interposed at the ends of the input and output lines 12 and 22, in conventional manner, to further reduce the possibility of undesired reflections from the terminated ends of the lines.

In accordance with a feature of the invention, the amplifiers 31, 32, and 33, instead of being of the single-ended type, comprise individual push-pull circuit arrangements as shown schematically for the amplifier 32. A center-tapped input coupling inductor 51 has an end 52 thereof connected to the center tap 38 of the input line inductor 14, and also connected to an input electrode 53 of an amplifier device 54 which in this embodiment is shown as comprising an electronic vacuum tube. The cathode 56 of tube 54 is electrically grounded, and the anode 57 thereof is connected to an end 58 of an output coupling inductor 59. A second amplifier device 61 of the amplifier 32 has an input electrode 62 connected to the remaining end of the input coupling inductor 51, a cathode 63 connected to electrical ground, and an anode 64 connected to the remaining end 66 of the output coupling inductor 59, and also connected to the center tap 39 of the output line inductor 24. A source 67 of input electrode bias voltage is connected between electrical ground and a center tap 68 of the input coupling inductor 51, and a source 71 of DC operating voltage is connected between electrical ground and a center tap 72 of the output coupling inductor 59. The amplifiers 31 and 33, as well as any additional amplifiers connected between the input and output distributed lines, comprise the same circuitry as shown for the amplifier 32. Each of the amplifiers operates in push-pull manner, because the input inductor 51 applies the input signal in a push-pull manner, i.e., in opposite phases, to the input electrodes 53 and 62 of the two amplifier devices 54 and 61, and the output coupling inductor 59 is connected for push-pull output. The center-tapped output coupling inductor 59 achieves self-cancellation of even harmonic distortion output products of the amplifier devices, the output signal for the stage being obtained from an end 66 of the output inductor 59, as shown. Thus, the amplifiers may be operated in Class B or AB, thereby achieving considerably higher efficiency, and hence greater signal output, than would be the case with a single amplifier device, and this greater efficiency and output is achieved without incurring undue signal distortion, due to the aforesaid cancellation of even harmonic distortion components in the output coupling inductor 59. Furthermore, if these harmonic distortion components were not cancelled and were permitted to reach the output line 22, they would partially reflect from the end loads of the line and undesirably increase the magnitude of signal voltage on the line, which may cause tube damage and/or line arc-over. In the embodiment shown, the input and output capacitances of the amplifier tubes, along with the stray capacitance provided by the input and output coupling inductors 51 and 59, plus stray wiring capacitance, constitute the shunt capacitances for the input and output distributed lines 12 and 22. The reason for employing unbalanced-to-ground signal input and output terminals 11 and 21, instead of push-pull signal connections, is that coaxial cable is normally used for conveying the input and output signals to and from the amplifier.

Since the even harmonic distortion components of the amplified signals are cancelled, as previously described, and are not fed into the output distributed line 22, the output signal at terminal 21 will constitute a faithful amplified replica of the input signal. The aforesaid Class AB or Class B operation of the amplifiers is achieved by suitably biasing the input electrodes 53 and 62 by means of bias voltage source 67 whereby the amplifier devices 61 and 54 are cyclically driven to or beyond the cutoff point so that no output current flows during at least a portion of alternate half cycles of signal voltage swing.

Figure 2:
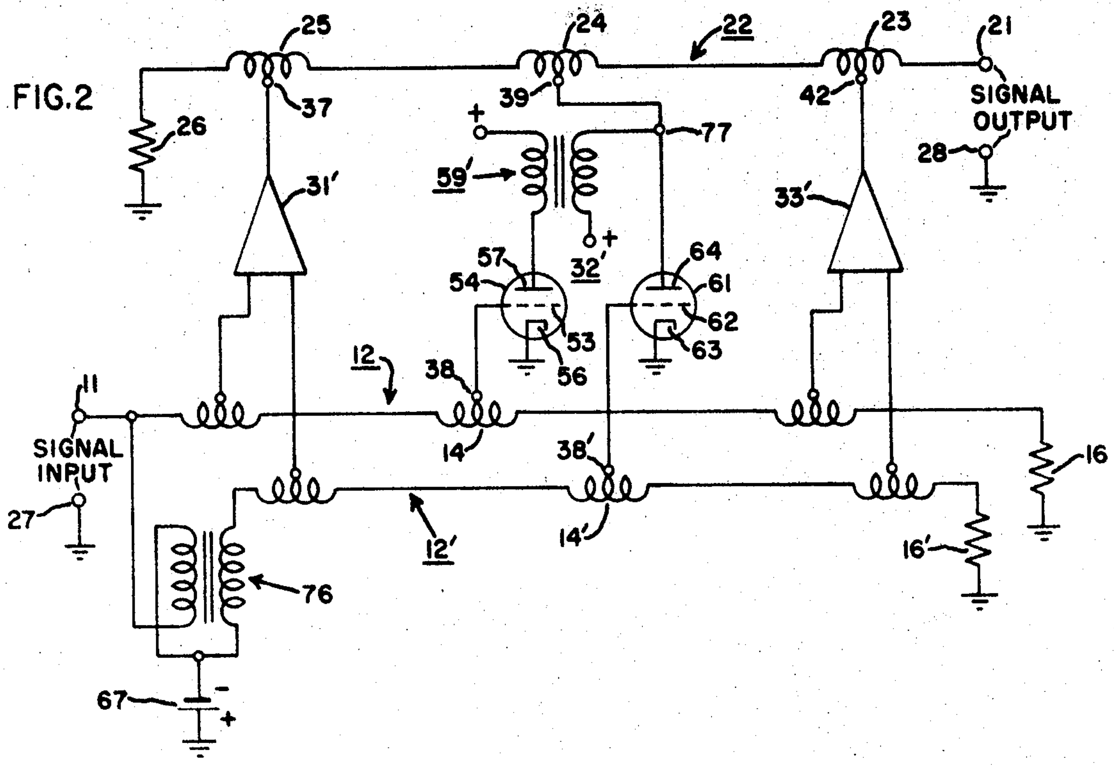
FIGS. 2 and 3 are electrical schematic diagrams of alternative preferred embodiments.

In the embodiment of FIG. 2, the output distributed line 22 is the same as in FIG. 1. Two input signal lines, 12 and 12′, are employed, which has an advantage, in certain designs, of providing more desirable impedance levels and permitting more realizable sizes of components. The input signal from input terminal 11 is applied directly to the line 12, and is applied to the line 12′ through a phase reversing transformer 76, so that the input signal is in a mutual push-pull relationship in the input lines 12 and 12′. In this embodiment, the amplifiers 31′, 32′ and 33′ have circuits as shown schematically for the amplifier 32′. The signal input electrode of the amplifier device 54 is connected to the input line tap 38, and the signal input electrode 62 of the amplifier device 61 is connected to the tap 38′ on the signal input line 12′. Thus, the input signal is applied in push-pull manner to the amplifier input electrodes 53 and 62. The output signal coupling device 59′ comprises a transformer having two identical windings, the anode 64 of amplifier device 61 being connected to an end 77 of one of these windings and to the tap 39 on the output distributed line 22. The output electrode 57 of the amplifier device 54 is connected to an end of the other winding of the output coupling device, as shown, and the remaining ends of the windings are connected to a source of operating voltage. The windings of the coupling device 59′ are connected in mutually opposite phases, so that the coupling device 59′ is connected in a push-pull manner for achieving push-pull amplifier operation and hence causing the cancelling of even harmonic distortion components, as described above in connection with FIG. 1. The phase inverting transformer 76 is employed at the input of the input signal distributed line 12′, because usually the input signal will be fed to input signal terminal 11 via a coaxial cable. However, the transformer 76 is not necessary if a push-pull input signal is available, in which event the push-pull input signal is applied directly to the input ends of the lines 12 and 12′.

Figure 3:
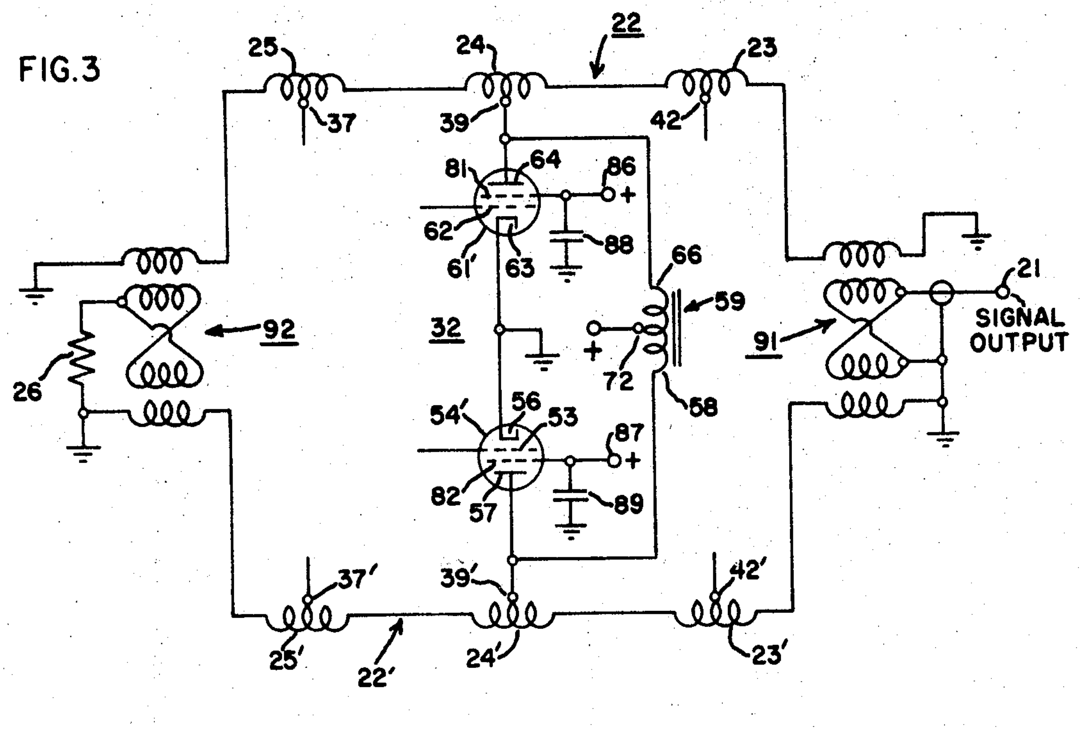

In the embodiment shown in FIG. 3, a pair of push-pull output distributed lines, 22 and 22′, are employed. The push-pull input signal to the input electrodes 62 and 53 of the amplifier devices 61′ and 54′, as well as to the other amplifier stages (not shown), may be provided by the coupling inductance means 51 shown in FIG. 1, or by the use of a pair of input lines as shown in FIG. 2. The amplifier devices 61′ and 54′ in FIG. 3 are shown as comprising tetrode vacuum tubes respectively provided with screen grid electrodes 81 and 82, which are supplied with suitable values of positive polarity operating voltage applied at terminals 86 and 87 are bypassed to electrical ground by means of bypass capacitors 88 and 89, respectively. Thus, the shunt capacitances of the output lines 22 and 22′ comprise primarily the capacitance between the anodes and screen grids of these amplifier devices plus the capacitance provided by the coupling device 59. The output lines 22 and 22′ are coupled to the signal output terminal 21 by means of a Balun impedance transformer 91, and the other ends of the output lines are coupled to the terminating resistor 26 by means of another Balun impedance transformer 92. As has been described in connection with previous embodiments, the even harmonic distortion components of the push-pull output signal are cancelled by the balanced coupling device 59, so that only the desired amplified signal is carried by the output distributed lines 22 and 22′. Therefore, the output lines 22 and 22′ do not carry the undesired distortion harmonic components, and in circuits where these lines are not exactly identical only the signal amplitude of the output signal at output terminal 21 will suffer, whereas in the prior art push-pull arrangements where two distributed amplifiers are coupled together in push-pull manner at their outputs, if the two distributed amplifiers are not identical then the even harmonic distortion components will not cancel out satisfactorily at the push-pull output termination of the two distributed amplifiers.

Figure 4:
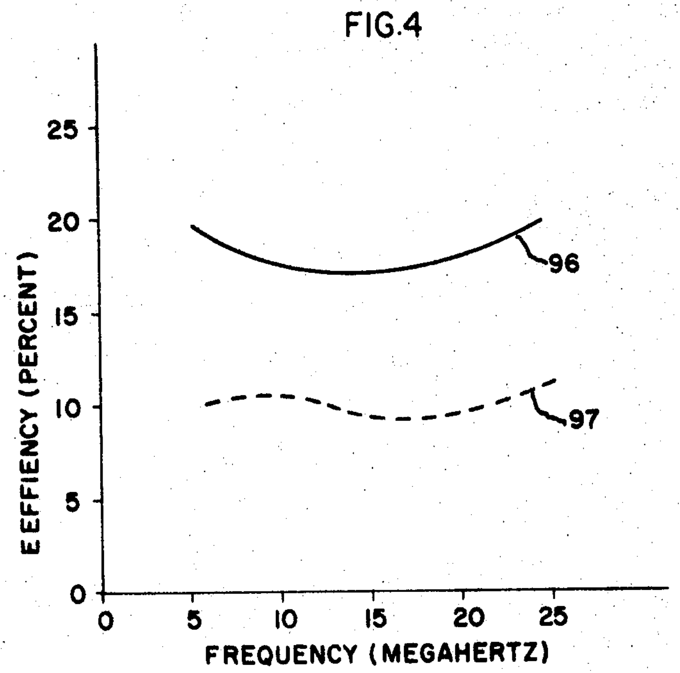
FIG. 4 is a graph showing the efficiency of an amplifier in accordance with the present invention, plotted against frequency, compared with that of a typical prior art push-pull distributed amplifier.

The graph of FIG. 4 shows, by the solid-line curve 96, the efficiency versus frequency of a push-pull distributed amplifier in accordance with the invention, whereas the dashed line 97 is representative of the lower efficiency achieved with a push-pull distributed amplifier of the prior art, operating at the same distortion level, wherein two single-ended distributed amplifier arrangements are connected in push-pull at the outputs thereof.

From the foregoing description, it will be realized that the present invention achieves a push-pull distributed amplifier capable of operating in the Class B or Class AB manner, with improved efficiency and lower distortion than has been achieved with prior art push-pull distributed amplifiers. This improvement is not only of benefit in amplifying broadband signals, but also has the advantage of making it more feasible than heretofore to employ a broad band power amplifier for amplifying narrow band signals such as broadcast or communication signals where it is desired to be able to change the carrier frequency (for security, or to avoid interfering or jamming signals, for example) without necessity for returning the power amplifier.

It will be noted that the embodiments disclosed herein employ various types of input and output distributed line arrays: FIG. 1 employs single-line input and output line arrays; in FIG. 2 the input line array consists of a pair of distributed lines while the output line array has a single line; and in FIG. 3 the output line array comprises two distributed lines, while the input line array can be a single line as in FIG. 1 or a pair of lines as in FIG. 2.

While preferred embodiments of the invention have been shown and described, various other embodiments and modifications thereof will become apparent to persons skilled in the art and will fall within the scope of the invention as defined in the following claims.

I claim:

1. A push-pull distributed amplifier circuit having signal input and output distributed line arrays, wherein the improvement comprises a plurality of push-pull amplifier stages respectively connected between distributed points along said input and output line arrays, each of said amplifier stages comprising a pair of amplifier devices having signal input and output electrodes, means connecting said signal input electrodes to said input distributed line array for push-pull signal input therefrom, each of said amplifier stages further comprising a balanced output signal coupling device having a first end and a second end, said first end of said balanced output signal coupling device being connected to said output electrode of one of said pair of amplifier devices of that amplifier stage and said second end of said balanced output signal coupling device being connected to said output electrode of the other of said pair of amplifier devices of that amplifier stage to cause said balanced output signal coupling device to receive and combine the respective push-pull signal outputs of the pair of said amplifier devices of that stage and to cancel even harmonic distortion components in their respective outputs as thus combined within each stage, respectively, and at least one end of said balanced output signal coupling device which is connected to one of said output electrodes of one of said pair of amplifier devices being connected to said output distributed line array for addition and output of the signals as amplified in said plurality of amplifier stages, thereby preventing said harmonic distortion components from entering said output distributed line array.

2. A circuit as claimed in claim 1, in which said balanced output signal coupling device comprises a center-tapped inductor respectively connected at the ends thereof to output electrodes of said amplifier devices, said circuit further including power supply means for said amplifier devices connected to the center tap of said output signal coupling device.

3. A circuit as claimed in claim 1, including power supply means for said amplifier devices, said balanced output signal coupling device comprising a transformer provided with a pair of similar windings, means connecting a first one of said windings between an output electrode of one of said amplifier devices and said power supply means, and means connecting the other of said windings between an output electrode of the other of said amplifier devices and said power supply means in relatively opposite electrical phase with respect to that of said first winding.

4. A circuit as claimed in claim 1, including a center-tapped signal input coupling inductor connected at the ends thereof to said input electrodes of said amplifier devices, respectively, and connected at least one of said ends to a point on said input signal distributed line array, bias voltage means connected to the center tap of said input coupling inductor, a balanced output coupling inductor means connected at ends thereof to output electrodes of said amplifier devices, respectively, means connecting one of said ends of the output coupling inductor means to a point on said output signal distributed line array, and power supply means connected to the electrical balance point of said output coupling inductor means.

5. A circuit as claimed in claim 1, in which said signal input distributed line array comprises a pair of distributed lines and includes means to apply an input signal in push-pull manner, to said input distributed lines and therethrough to said signal input electrodes of the pair of amplifier devices of each of said amplifier stages, and wherein said balanced output coupling device comprises inductor means connected at ends thereof to output electrodes of said amplifier devices, respectively, and connected at at least one of said ends to a point on said output signal distributed line array, and power supply means connected to the electrical balance point of said output coupling means.